United States Patent
Chen et al.

(10) Patent No.: US 8,817,521 B2
(45) Date of Patent: *Aug. 26, 2014

(54) CONTROL METHOD FOR MEMORY CELL

(75) Inventors: Yu-Sheng Chen, Taoyuan (TW); Heng-Yuan Lee, Zhudong Township (TW); Yen-Ya Hsu, Taipei (TW); Pang-Shiu Chen, Hsinchu (TW); Ching-Chih Hsu, Xinpu Township (TW); Frederick T. Chen, Zhubei (TW)

(73) Assignee: Industrial Technology Research Institute, Hsinchu (TW)

( * ) Notice: Subject to any disclaimer, the term of this patent is extended or adjusted under 35 U.S.C. 154(b) by 108 days.

This patent is subject to a terminal disclaimer.

(21) Appl. No.: 13/488,937

(22) Filed: Jun. 5, 2012

(65) Prior Publication Data

US 2012/0243346 A1    Sep. 27, 2012

Related U.S. Application Data (63) Continuation-in-part of application No. 12/649,286, filed on Dec. 29, 2009, now Pat. No. 8,223,528.

(30) Foreign Application Priority Data

Nov. 24, 2009   (TW) .................................. 098139877

(51) Int. Cl.
    *G11C 11/00*    (2006.01)
(52) U.S. Cl.
    USPC ........................ 365/148; 365/163; 365/189.16
(58) Field of Classification Search
    USPC ...................... 365/148, 163, 189.16
    See application file for complete search history.

(56) References Cited

U.S. PATENT DOCUMENTS

| | | | |
|---|---|---|---|
| 5,748,538 A * | 5/1998 | Lee et al. ................. | 365/185.06 |
| 6,707,718 B1 * | 3/2004 | Halim et al. .............. | 365/185.22 |
| 7,006,371 B2 | 2/2006 | Matsuoka | |
| 7,289,351 B1 | 10/2007 | Chen | |
| 7,330,387 B2 * | 2/2008 | Lindstedt et al. ............. | 365/205 |
| 7,342,824 B2 | 3/2008 | Hsu | |
| 7,440,315 B2 | 10/2008 | Lung | |
| 7,480,174 B2 | 1/2009 | Lee | |
| 7,483,292 B2 | 1/2009 | Lung | |
| 7,508,695 B2 | 3/2009 | Sugita | |
| 7,544,968 B1 | 6/2009 | Toutounchi | |

(Continued)

OTHER PUBLICATIONS

Office Action of corresponding TW application, issued on Jul. 18, 2013.

*Primary Examiner* — Pho M Luu
(74) *Attorney, Agent, or Firm* — Wang Law Firm, Inc.; Li K. Wang; Stephen Hsu (57) ABSTRACT

A control method for at least one memory cell is disclosed. The memory cell includes a transistor and a resistor. The resistor is connected to the transistor in series between a first node and a second node. In a programming mode, the memory cell is programmed. When it is determined that the memory cell has been successfully programmed, impedance of the memory cell is in a first state. When it is determined that the memory cell has not been successfully programmed, a specific action is executed to reset the memory cell. The impedance of the memory cell is in a second state after the step resetting the memory cell. The impedance of the memory cell in the second state is higher than that of the memory cell in the first state.

31 Claims, 11 Drawing Sheets

(56) References Cited

U.S. PATENT DOCUMENTS

| | | | |
|---|---|---|---|
| 7,688,635 B2* | 3/2010 | Tang | 365/185.21 |
| 8,223,528 B2* | 7/2012 | Chen et al. | 365/148 |
| 2004/0257864 A1 | 12/2004 | Tamai | |
| 2005/0141261 A1 | 6/2005 | Ahn | |
| 2006/0126380 A1* | 6/2006 | Osada et al. | 365/163 |
| 2007/0186761 A1 | 8/2007 | Perry | |
| 2007/0228370 A1 | 10/2007 | Lee | |
| 2008/0062740 A1 | 3/2008 | Baek | |
| 2008/0130381 A1 | 6/2008 | Van Buskirk | |
| 2008/0165572 A1 | 7/2008 | Lung | |
| 2008/0266933 A1 | 10/2008 | Chen | |
| 2008/0291716 A1 | 11/2008 | Futatsuyama | |
| 2009/0003066 A1 | 1/2009 | Park | |

* cited by examiner

FIG. 8 ical Field
The disclosure relates to a control method, and more particularly to a control method for at least one memory cell.
2. Description of the Related Art
The impedance of a resistance type memory is easily differentiated between a low state and a high state. Efficiency of the resistance type memory becomes lower as time goes by. Thus, for a resistance type memory in operation for a long period of time, error may occur in reading or writing thereof.

BRIEF SUMMARY OF THE DISCLOSURE

A control method for at least one memory cell is provided. The memory cell comprises a transistor and a resistor. The resistor is connected to the transistor in series between a first node and a second node. An exemplary embodiment of a control method for at least one memory cell is described in the following. In a programming mode, the memory cell is programmed. The step of programming the memory cell comprises providing a first controlling voltage to a gate of the transistor, providing a first setting voltage to the first node, and providing a second setting voltage to the second node. It is determined whether the memory cell has been successfully programmed. If the memory cell has been successfully programmed, a specific action is executed. The specific action is to reset the memory cell, and the step of resetting the memory cell comprises providing a second controlling voltage to the gate of the transistor, wherein the first controlling voltage is less than the second controlling voltage; providing a first reset voltage to the first node; and providing a second reset voltage to the second node, wherein the impedance of the memory cell is in a second state after the step of resetting the memory cell, and wherein the impedance of the memory cell in the second state is higher than the impedance of the memory cell in the first state.

Another exemplary embodiment of a control method for at least one memory cell is described in the following. In a programming mode, the memory cell is programmed. The step of programming the memory cell comprises providing a first controlling voltage to a gate of the transistor, providing a first setting voltage to the first node, and providing a second setting voltage to the second node. It is determined whether the memory cell has been successfully programmed. If the memory cell has been successfully programmed, a specific action is executed. The specific action is to reset the memory cell, and the step of resetting the memory cell comprises providing a second controlling voltage to the gate of the transistor, wherein the first controlling voltage is less than the second controlling voltage; providing a first reset voltage to the first node; and providing a second reset voltage to the second node. The impedance of the memory cell is in a second state when the memory cell is successfully reset. The impedance of the memory cell in the second state is higher than the impedance of the memory cell in the first state.

A detailed description is given in the following embodiments with reference to the accompanying drawings.

BRIEF DESCRIPTION OF THE DRAWINGS

The disclosure can be more fully understood by referring to the following detailed description and examples with references made to the accompanying drawings, wherein.

DETAILED DESCRIPTION OF THE DISCLOSURE

The following description is of the contemplated mode of carrying out the disclosure. This description is made for the purpose of illustrating the general principles of the disclosure and should not be taken in a limiting sense. The scope of the disclosure is determined by reference to the appended claims.

Figure 1A:
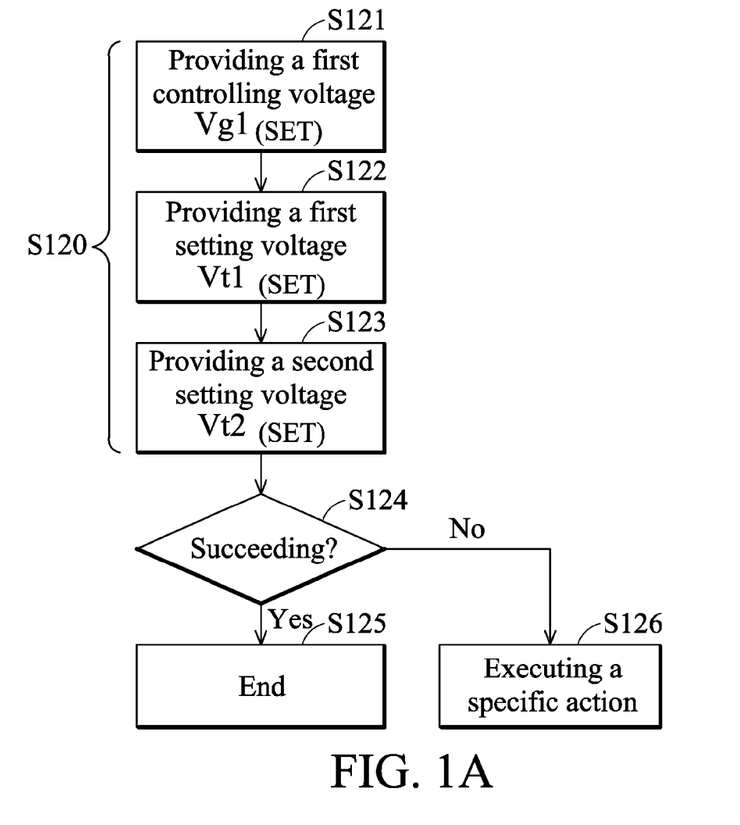
FIG. 1A is a schematic diagram of an exemplary embodiment of a control method of the disclosure.
Figure 1B:
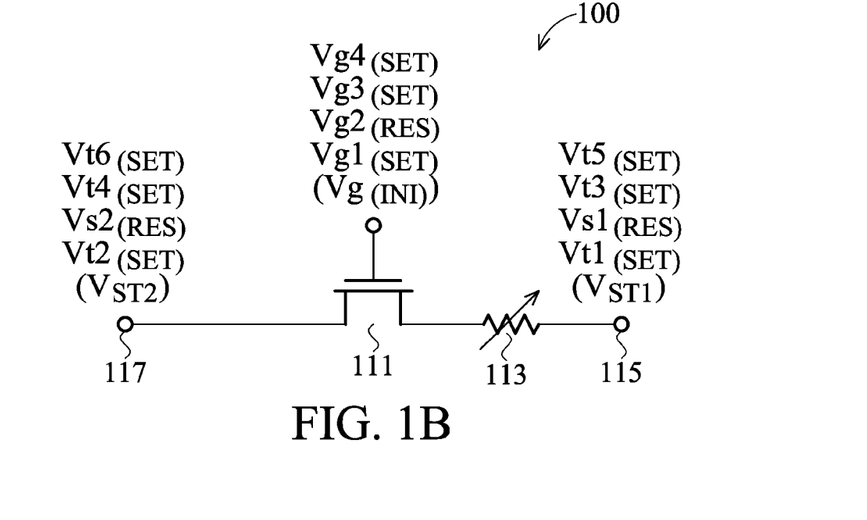
FIG. 1B is a schematic diagram of an exemplary embodiment of a memory cell of the disclosure.

FIG. 1A is a schematic diagram of an exemplary embodiment of a control method of the disclosure. The control method is applied to at least one memory cell. FIG. 1B is a schematic diagram of an exemplary embodiment of a memory cell of the disclosure. The memory cell 100 comprises a transistor 111 and a resistor 113. The transistor is serially connected to the resistor 113 between nodes 115 and 117. In this embodiment, when the memory cell 100 is programmed, the impedance of the memory cell 100 is in a low state. When the memory cell 100 is reset, the impedance of the memory cell 100 is in a high state.

Referring FIG. 1A, the memory cell is programmed in a programming mode (step S120). In this embodiment, the step S120 comprises steps S121~S123. The disclosure does not limit the sequence of executing the steps S121~S123. In one embodiment, the steps S121~S123 are sequentially executed. In another embodiment, the steps S121~S123 are not sequentially executed.

A first controlling voltage $Vg1_{(SET)}$ is provided to the gate of the transistor 111 (step S121). A first setting voltage $Vt1_{(SET)}$ is provided to the node 115 (step S122). A second setting voltage $Vt2_{(SET)}$ is provided to the node 117 (step S123).

It is determined whether the memory cell 100 has been successfully programmed (step S124). When the memory cell 100 has been successfully programmed, the impedance of the memory cell 100 is in a low state. Thus, the state of the impedance of the memory cell 100 may be utilized to determine whether the memory cell 100 has been successfully programmed.

If the memory cell 100 has been successfully programmed (i.e. the impedance of the memory cell 100 is in a low state), the programming procedure ends (step S125). If it is determined that the memory cell 100 has not been successfully programmed (i.e. the impedance of the memory cell 100 is in a high state), a specific action is executed (step S126).

Figure 2:
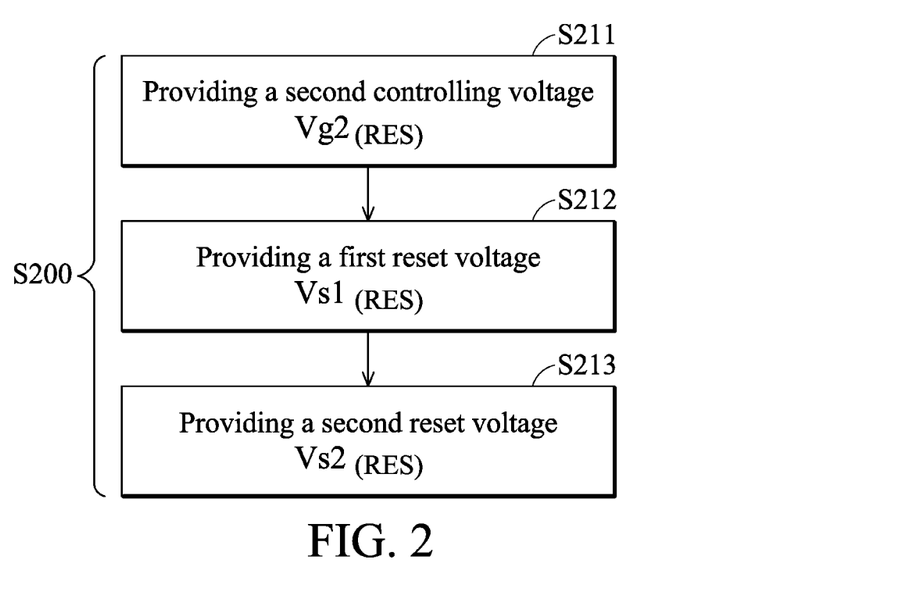
FIG. 2 is a schematic diagram of an exemplary embodiment of a specific action of the disclosure.

The disclosure does not limit the type of the specific action. A more detailed description follows. FIG. 2 is a schematic diagram of an exemplary embodiment of a specific action of the disclosure. In this embodiment, when the memory cell 100 has not been successfully programmed, the specific action is to reset the memory cell 100. When the memory cell 100 is reset, the impedance of the memory cell 100 is in a high state.

In this embodiment, the step 200 of resetting the memory cell 100 comprises steps S211~S213. In the step S211, a second controlling voltage $Vg2_{(RES)}$ is provided to the gate of the transistor 111. In one embodiment, the controlling voltage $Vg1_{(SET)}$ is less than the second controlling voltage $Vg2_{(RES)}$.

In the step S212, a first reset voltage $Vs1_{(RES)}$ is provided to the node 115. In the step S213, a second reset voltage $Vs2_{(RES)}$ is provided to the node 117.

In one embodiment, the first setting voltage $Vt1_{(SET)}$ and the second reset voltage $Vs2_{(RES)}$ are positive. In this case, the second setting voltage $Vt2_{(SET)}$ is equal to the first reset voltage $Vs1_{(RES)}$. For example, the second setting voltage $Vt2_{(SET)}$ and the first reset voltage $Vs1_{(RES)}$ are ground voltages. In some embodiments, the first setting voltage $Vt1_{(SET)}$ is greater than the second reset voltage $Vs2_{(RES)}$, but the disclosure is not limited thereto.

In another embodiment, the first setting voltage $Vt1_{(SET)}$ is positive and the first reset voltage $Vs1_{(RES)}$ is negative. In this case, the second setting voltage $Vt2_{(SET)}$ is equal to the second reset voltage $Vs2_{(RES)}$. For example, the second setting voltage $Vt2_{(SET)}$ and the second reset voltage $Vs2_{(RES)}$ are ground voltages.

Further, the disclosure does not limit the sequence of the steps S211~S213. In this embodiment, the steps S211~213 are sequentially executed. In other embodiments, the steps S211~213 are not sequentially executed.

Figure 3A:
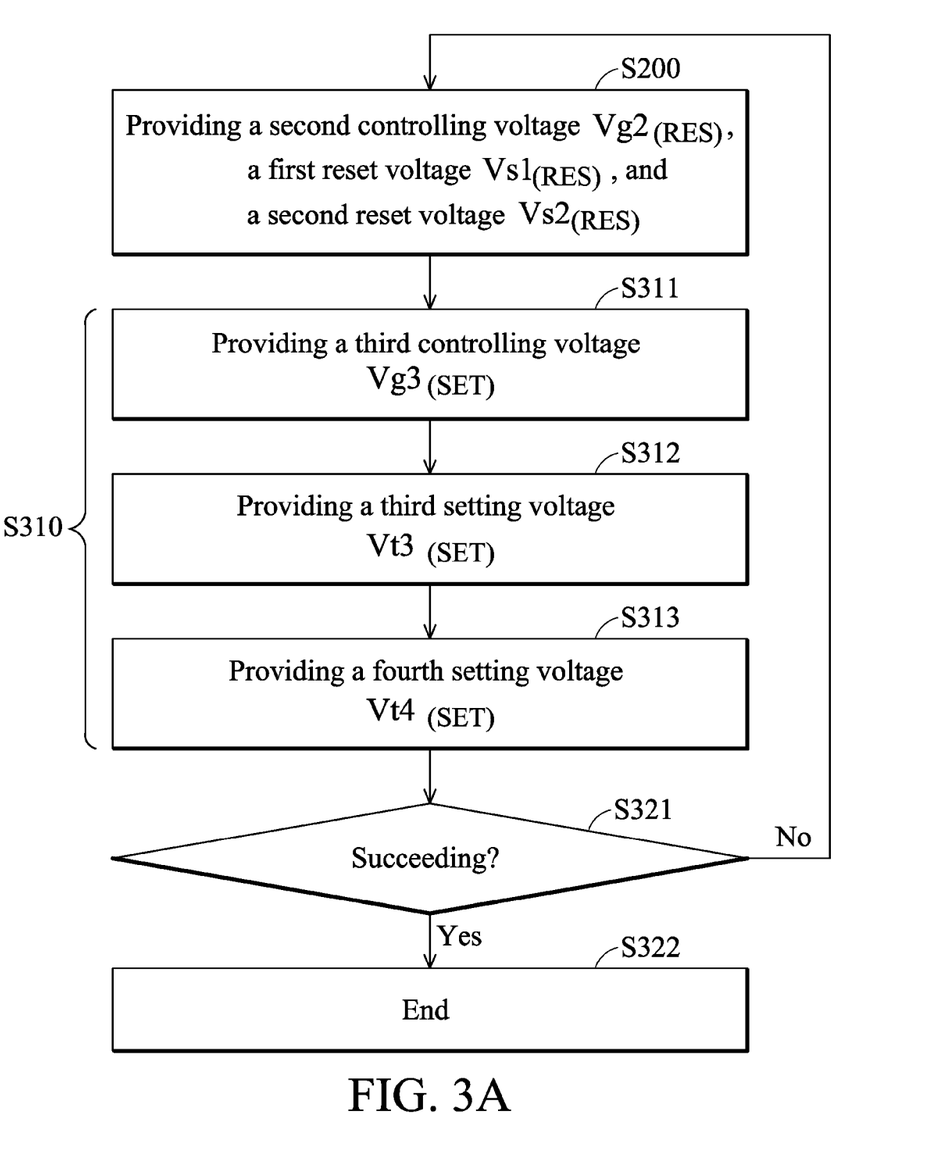
FIGS. 3A, 3B, 4A, and 4B are schematic diagrams of other exemplary embodiments of the specific action of the disclosure.

FIG. 3A is a schematic diagram of another exemplary embodiment of a specific action of the disclosure. FIG. 3A is similar to FIG. 2 except for the addition of steps S310 and S321~S322. In this embodiment, the step S310 is to program the memory cell 100 again.

The step S310 comprises steps S311~S313. In the step S311, a third controlling voltage $Vg3_{(SET)}$ is provided to the gate of the transistor 111. In one embodiment, the third controlling voltage $Vg3_{(SET)}$ is less than the second controlling voltage $Vg2_{(RES)}$. In another embodiment, the third controlling voltage $Vg3_{(SET)}$ is equal to the first controlling voltage $Vg1_{(SET)}$.

In the step S312, a third setting voltage $Vt3_{(SET)}$ is provided to the node 115. In one embodiment, the third setting voltage $Vt3_{(SET)}$ is greater than the first setting voltage $Vt1_{(SET)}$.

In the step S313, a fourth setting voltage $Vt4_{(SET)}$ is provided to the node 117. In one embodiment, the fourth setting voltage $Vt4_{(SET)}$ is equal to the second setting voltage $Vt2_{(SET)}$.

In some embodiments, the third controlling voltage $Vg3_{(SET)}$ is greater than the first controlling voltage $Vg1_{(SET)}$. In this case, the third setting voltage $Vt3_{(SET)}$ is equal to the first setting voltage $Vt1_{(SET)}$ and the fourth setting voltage $Vt4_{(SET)}$ is equal to the second setting voltage $Vt2_{(SET)}$. Additionally, the third controlling voltage $Vg3_{(SET)}$ is less than the second controlling voltage $Vg2_{(RES)}$, but the disclosure is not limited thereto.

Figure 3B:
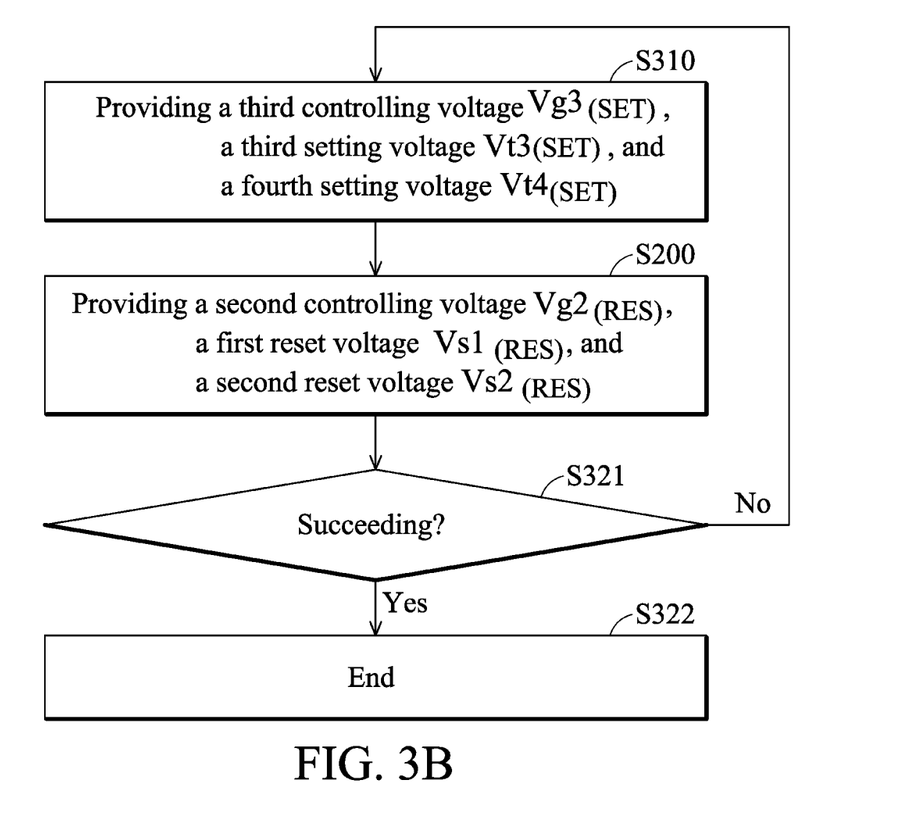

Furthermore, the disclosure does not limit the sequence of executing the steps 200 and S310. In FIG. 3A, the step S200 of resetting the memory cell is executed and then the step S310 of programming the memory cell is executed again. In some embodiments, the step S310 of programming the memory cell is executed and then the step S200 of resetting the memory cell is executed as shown in FIG. 3B.

Similarly, the disclosure does not limit the sequence of the steps S311~S313. In one embodiment, the steps S311~S313 are sequentially executed. In another embodiment, the steps S311~S313 are not sequentially executed.

Referring to FIG. 3A, when the step S310 is executed, it is determined whether the memory cell has been successfully programmed (step S321). If the memory cell has been successfully programmed, the programming procedure ends (step S322). If the memory cell has not been successfully programmed, the step S200 is executed to reset the memory and again program the memory cell. At this time, the times of programming the memory cell is 3.

When the memory cell is reset again, the second controlling voltage $Vg2_{(RES)}$, the first reset voltage $Vs1_{(RES)}$, the second reset voltage $Vs2_{(RES)}$ are maintained at levels which are the same as that previously utilized, in one embodiment. In other words, the voltages for resetting the memory cell during a first attempt are equal to the voltage for resetting the memory cell during a second attempt.

However, a portion of the voltages for programming the memory cell during a third attempt may not be equal to a portion of the voltages for programming the memory cell during the second attempt. For example, when the memory cell has been programmed during a first attempt, the third controlling voltage $Vg3_{(SET)}$ may be 1.4V, the third setting voltage $Vt3_{(SET)}$ may be 2.0V, and the fourth setting voltage $Vt4_{(SET)}$ may be 0V.

If it is determined that the memory cell has not been successfully programmed following the first attempt, the third controlling voltage $Vg3_{(SET)}$ may be maintained at 1.4V or adjusted to 2.0V, the third setting voltage $Vt3_{(SET)}$ may be adjusted to 2.5V or maintained at 2.0V, and the fourth setting voltage $Vt4_{(SET)}$ may be maintained at 0V to program the memory during a second attempt.

If it is determined that the memory cell has not been successfully programmed during a second attempt, the third controlling voltage $Vg3_{(SET)}$ may be maintained at 1.4V or adjusted to 2.5V, the third setting voltage $Vt3_{(SET)}$ may adjusted to 3.0V or maintained at 2.0V, and the fourth setting voltage $Vt4_{(SET)}$ may be maintained at 0V to program the memory during a third attempt.

In one embodiment, if it is determined that the memory cell has not been successfully programmed, the voltage of the node 115 is increased to successfully program the memory cell. In another embodiment, if it is determined that the memory cell has not been successfully programmed, the voltage of the node 115 is maintained and the controlling voltage provided to the transistor 111 is increased such that the impedance of the memory cell 100 is adjusted to a low state.

Figure 4A:
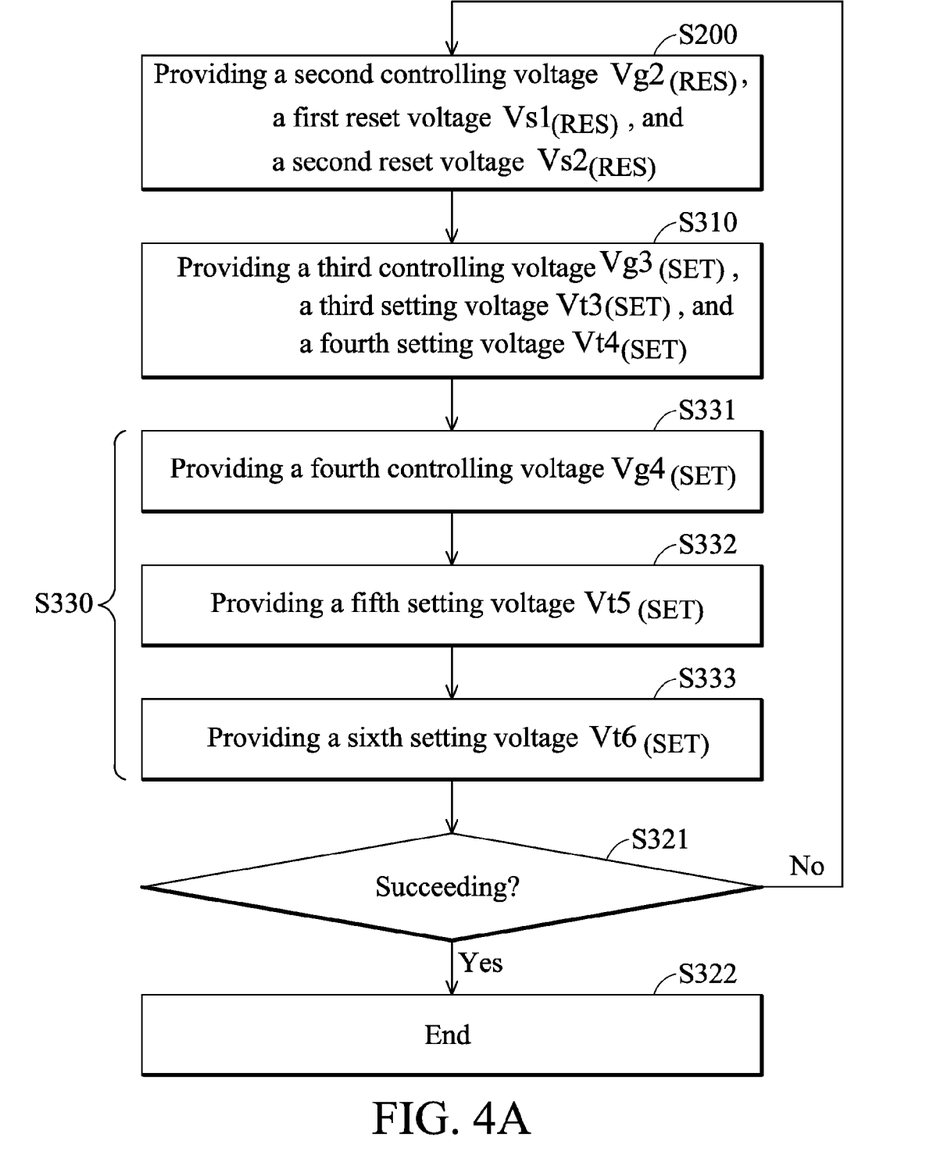
Figure 4B:
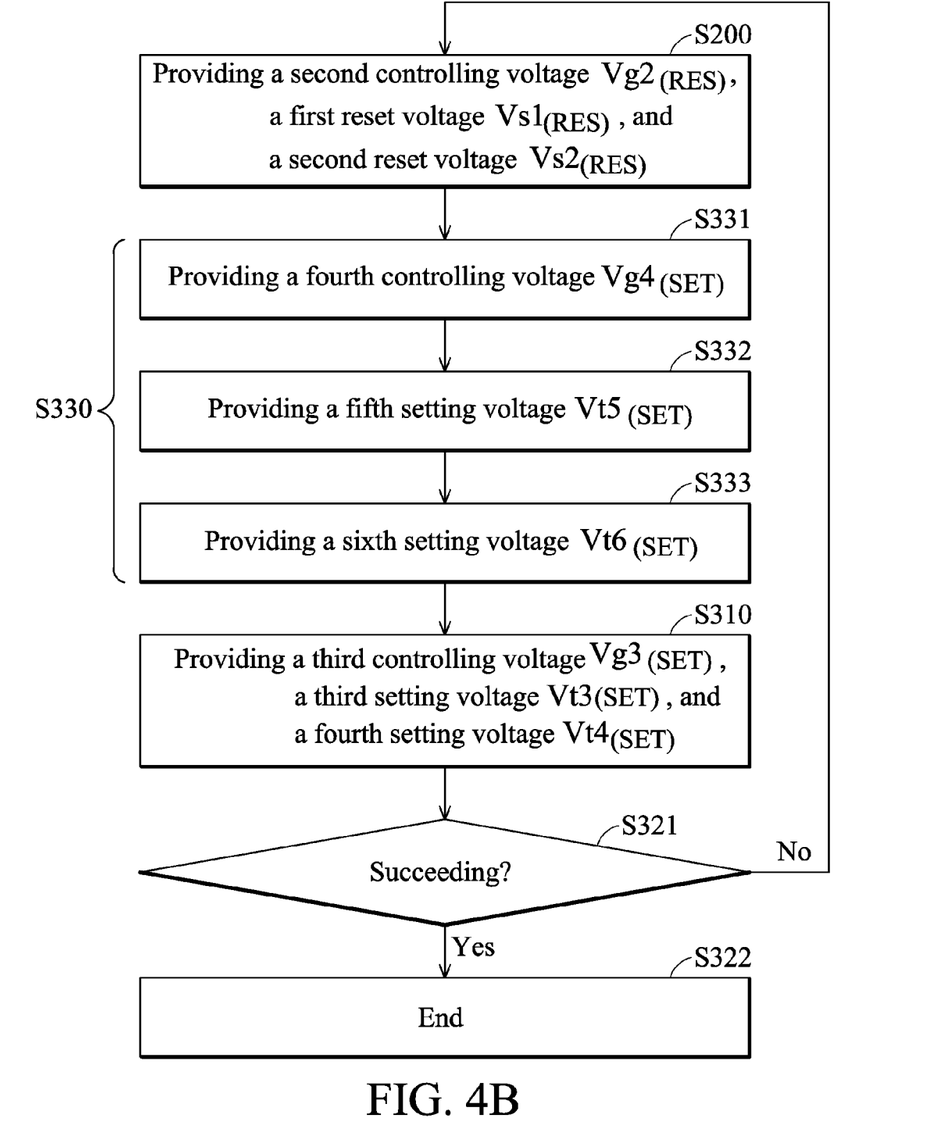

FIG. 4A is a schematic diagram of another exemplary embodiment of a specific action of the disclosure. FIG. 4A is similar to FIG. 3A except for the addition of step S330. The step S330 is similar to the step S310 except for the voltages, wherein the voltages utilized in the step S330 are different from the voltage utilized in the step S310.

In the step S331, a fourth controlling voltage $Vg4_{(SET)}$ is provided to the gate of the transistor 111. In one embodiment, the fourth controlling voltage $Vg4_{(SET)}$ of the step S331 is equal to the third controlling voltage $Vg3_{(SET)}$ of the step S310. The third controlling voltage $Vg3_{(SET)}$ may be equal to the first controlling voltage $Vg1_{(SET)}$ of step S121 shown in FIG. 1A. In this case, the fourth controlling voltage $Vg4_{(SET)}$ is less than the second controlling voltage $Vg2_{(RES)}$ of the step S200.

In the step S332, a fifth setting voltage $Vt5_{(SET)}$ is provided to the node 115. In the step S333, a sixth setting voltage $Vt6_{(SET)}$ is provided to the node 117. In one embodiment, the fifth setting voltage $Vt5_{(SET)}$ is greater than the third setting voltage $Vt3_{(SET)}$ of the step S310. Additionally, the third setting voltage $Vt3_{(SET)}$ of the step S310 is greater than the first setting voltage $Vt1_{(SET)}$ of the step S122 shown in FIG. 1A.

In above embodiments, the difference between the fifth setting voltage $Vt5_{(SET)}$ and the third setting voltage $Vt3_{(SET)}$ is equal to the difference between the third setting voltage $Vt3_{(SET)}$ and the first setting voltage $Vt1_{(SET)}$. In this case, the sixth setting voltage $Vt6_{(SET)}$ is equal to the fourth setting voltage $Vt4_{(SET)}$ and the fourth setting voltage $Vt4_{(SET)}$ is equal to the second setting voltage $Vt2_{(SET)}$.

In other embodiments, the fourth controlling voltage $Vg4_{(SET)}$ of the step S331 is greater than the third controlling voltage $Vg3_{(SET)}$ of the step S310. The third controlling voltage $Vg3_{(SET)}$ is greater than the first controlling voltage $Vg1_{(SET)}$ of the step S121 shown in FIG. 1A. In this case, the fifth setting voltage $Vt5_{(SET)}$ is equal to the third setting voltage $Vt3_{(SET)}$ of the step S310. The third setting voltage $Vt3_{(SET)}$ is equal to the first setting voltage $Vt1_{(SET)}$ of the step S122 shown in FIG. 1A.

Additionally, the sixth setting voltage $Vt6_{(SET)}$ of the step S333 is equal to the fourth setting voltage $Vt4_{(SET)}$ of the step S310. The fourth setting voltage $Vt4_{(SET)}$ is equal to the second setting voltage $Vt2_{(SET)}$ of the step S123 shown in FIG. 1A. In one embodiment, the fourth controlling voltage $Vg4_{(SET)}$ is less than the second controlling voltage $Vg2_{(RES)}$ of the step S200.

Figure 5A:
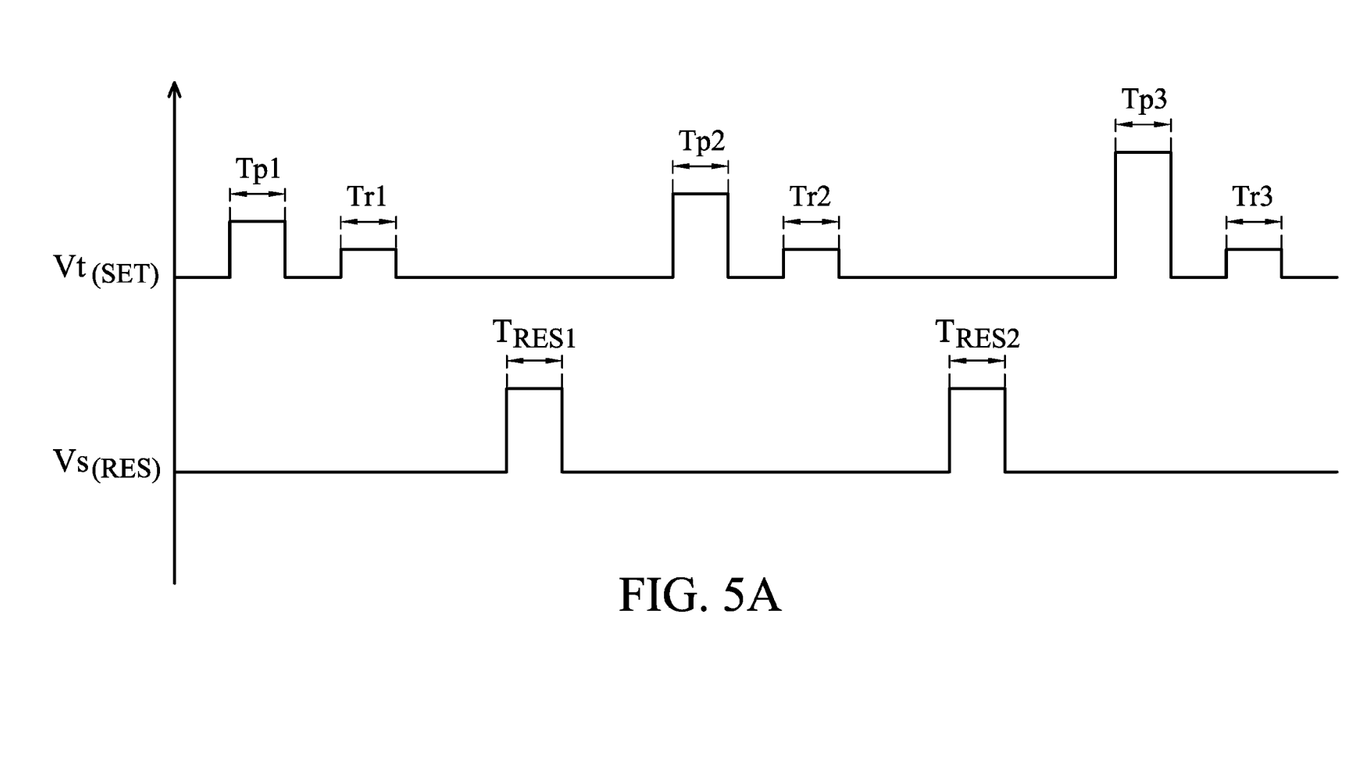
FIG. 5A is a timing diagram of an exemplary embodiment of the control method of the disclosure.

FIG. 5A is a timing diagram of an exemplary embodiment of the control method of the disclosure. During the programming period Tp1, setting voltages are provided to a memory cell. During the read period Tr1, the state of the memory cell is read. If the impedance of the memory cell is in a high state, a reset voltage $Vs_{(RES)}$ is provided to the memory cell to reset the memory cell during the reset period $T_{RES1}$.

Then, new setting voltages are provided to the memory cell during the programming period Tp2, wherein a portion of the setting voltages during the programming period Tp2 is greater than the portion of the setting voltages during the programming period Tp1. During the read period Tr2, the state of the memory cell is read again. If the impedance of the memory cell is in a high state, the memory cell is reset again during the reset period $T_{RES2}$.

Next, new setting voltages are provided to the memory cell during the programming period Tp3, wherein a portion of the setting voltages during the programming period Tp3 is greater than the portion of the setting voltages during the programming period Tp2. During the read period Tr3, the state of the memory cell is read again until the impedance of the memory cell is in a low state.

In this embodiment, a portion of the setting voltages $Vt_{(SET)}$ is gradually increased, but the disclosure is not limited thereto. In some embodiments, for the duration of the programming periods Tp1~Tp3, the reset periods $T_{RES1}$, $T_{RES2}$ are adjusted or a portion of the reset voltages $Vs_{(RES)}$ is gradually increased to successfully program the memory cell.

Figure 5B:
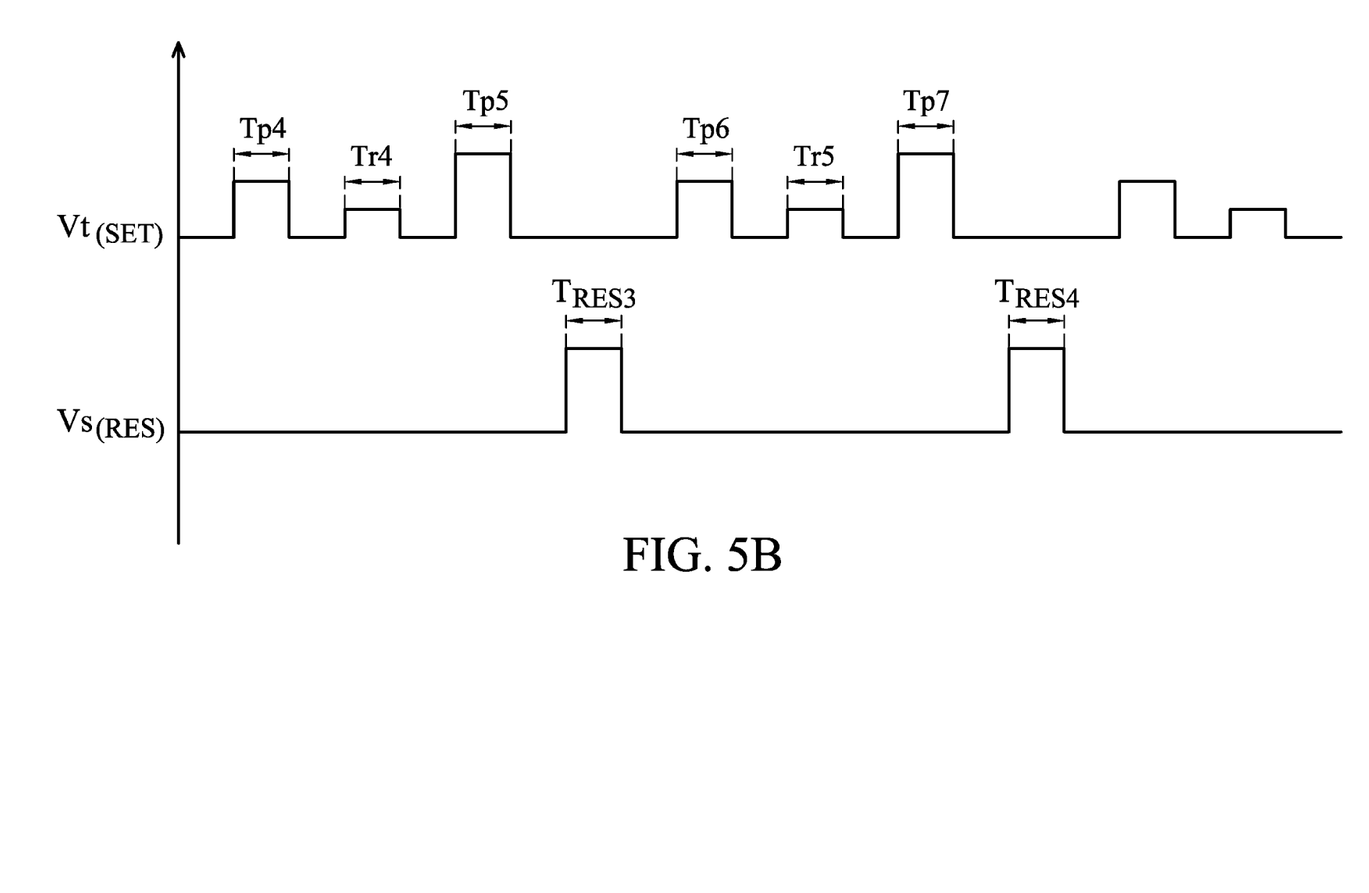
FIG. 5B is a timing diagram of another exemplary embodiment of the control method of the disclosure.

FIG. 5B is a timing diagram of another exemplary embodiment of the control method of the disclosure. During the programming period Tp4, setting voltages are provided to the memory cell. During the reset period, the state of the memory cell is read. If the impedance of the memory cell is in a high state, new setting voltages are provided to the memory cell during the programming period Tp5, wherein a portion of the setting voltages during the programming period Tp5 is greater than a portion of the setting voltages during the programming period Tp4.

During the reset period $T_{TRES3}$, reset voltages are provided to the memory cell. During the programming period Tp6, new setting voltages are provided to the memory cell. In this embodiment, the setting voltages during the programming period Tp6 are the same as the setting voltages during the programming period Tp4. During the read period Tr5, the state of the memory cell is read. If the impedance of the memory cell is in a high state, new setting voltages are provided to the memory cell during the programming period Tp7, wherein a portion of the setting voltages during the programming period Tp7 is greater than a portion of the setting voltages during the programming period Tp6. In this embodiment, the setting voltages during the programming period Tp4 are the same as the setting voltages during the programming period Tp6.

Figure 6:
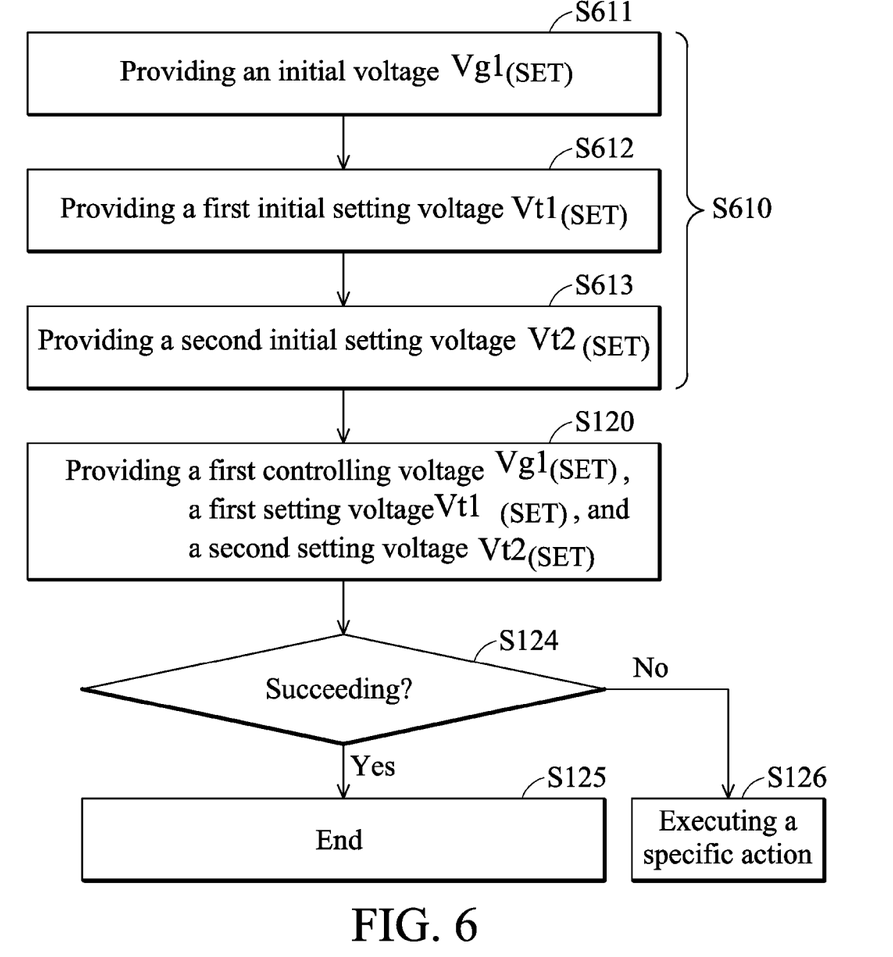
FIG. 6 is a schematic diagram of another exemplary embodiment of the control method of the disclosure.

FIG. 6 is a schematic diagram of another exemplary embodiment of the control method of the disclosure. FIG. 6 is similar to FIG. 1A except for the addition of step S610. The step S610 comprises steps S611~S613.

In a forming mode, an initial voltage $Vg_{(INI)}$ is provided to the gate of the transistor 111 (step S611). In one embodiment, the initial voltage $Vg_{(INI)}$ is less than the first controlling voltage $Vg1_{(SET)}$ of the step S121 shown in FIG. 1A, but the disclosure is not limited thereto. In some embodiments, the initial voltage $Vg_{(INI)}$ is less than the second controlling voltage $Vg2_{(RES)}$ of the step S211 shown in FIG. 2.

In the step S612, a first initial setting voltage $V_{SI1}$ is provided to the node 115. In one embodiment, the first initial setting voltage $V_{SI1}$ is greater than the first setting voltage $Vt1_{(SET)}$ of the step S122 shown in FIG. 1A. In other embodiments, the first initial setting voltage $V_{SI1}$ is greater than the fifth setting voltage $Vt5_{(SET)}$ of the step S332 shown in FIG. 4A.

In the step S613, a second initial setting voltage $V_{SI2}$ is provided to the node 117. In one embodiment, the second initial setting voltage $V_{SI2}$ is equal to the second setting voltage $Vt2_{(SET)}$ of the step S123 shown in FIG. 1A.

When the memory cell has been successfully programmed, the impedance of the memory cell is in a low state. If the impedance of the memory cell is in a high state, it means that the memory cell has not been successfully programmed. Thus, a specific action is executed.

The specific action is to reset the memory cell or program the memory cell again. In one embodiment, the specific action is to reset the memory cell and then program the memory cell again. In another embodiment, the specific action is to again program the memory cell and then reset the memory cell. When the memory cell is programmed again, high voltages are provided to the transistor to successfully program the memory cell.

Figure 7:
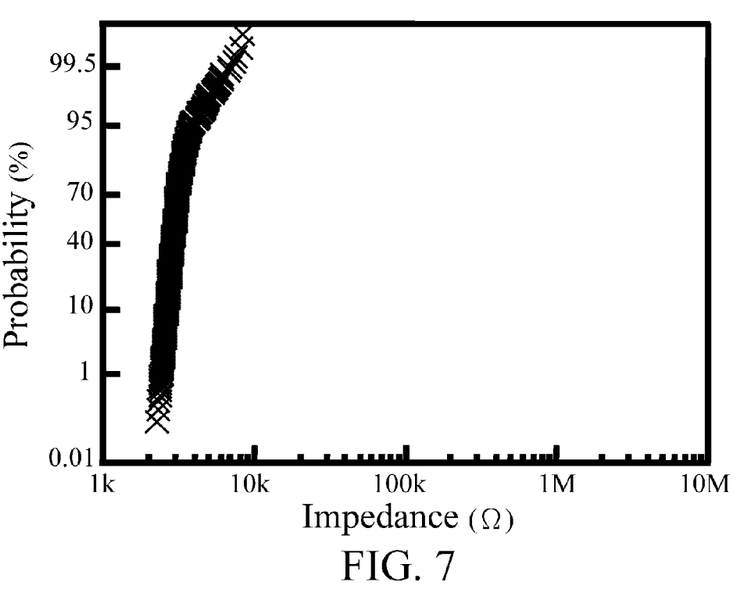
FIG. 7 is a schematic diagram illustrating a result utilizing the control method of the disclosure.

FIG. 7 is a schematic diagram illustrating a result utilizing the control method of the disclosure. Assuming the control method is applied to one thousand memory cells. After programming the memory cells, the impedances of all memory cells are in a low state (below 10Ω).

Figure 8:
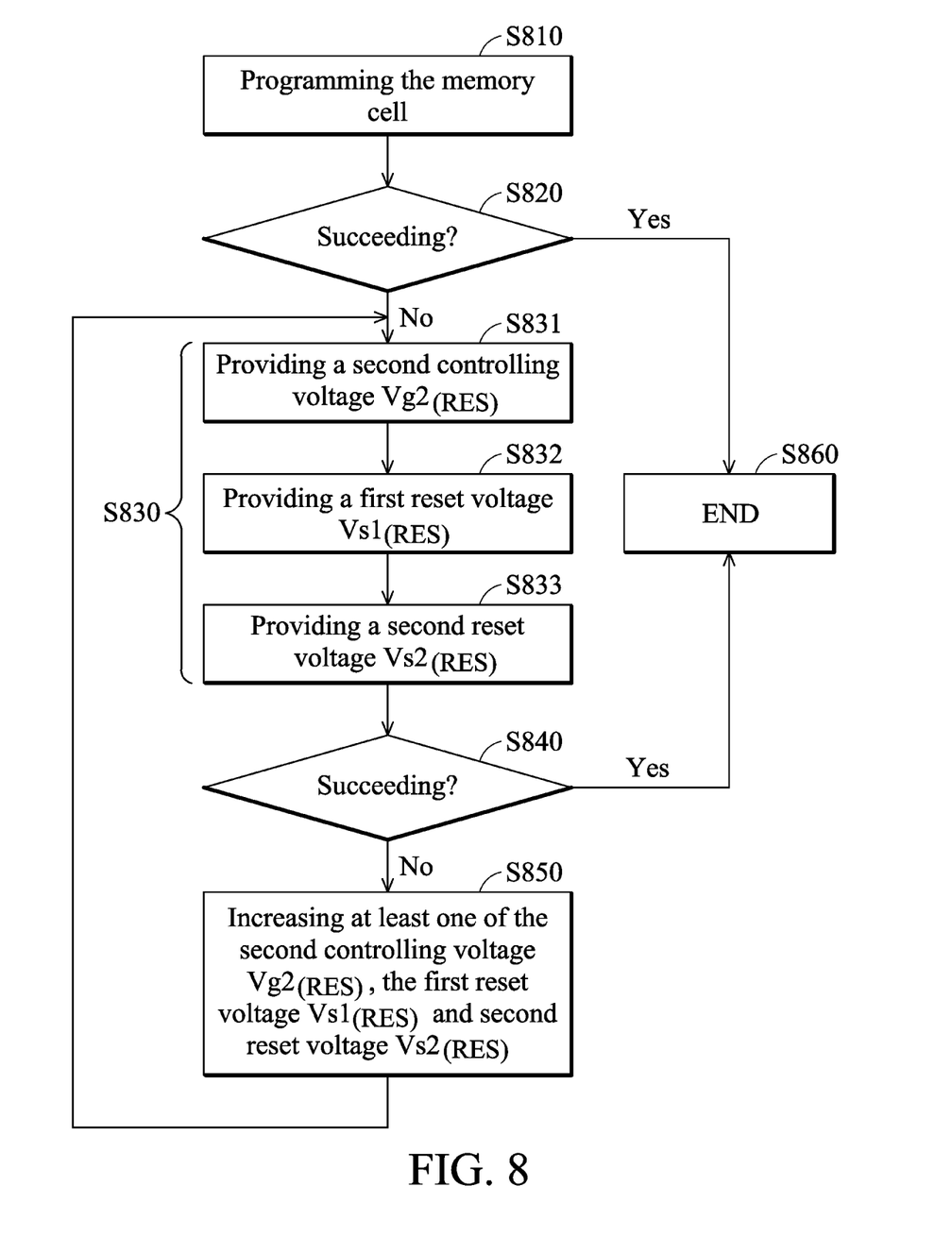
FIG. 8 is a schematic diagram of another exemplary embodiment of a specific action of the disclosure.

FIG. 8 is a schematic diagram of other exemplary embodiments of a specific action of the disclosure. In this embodiment, when the memory cell 100 has not been successfully programmed, the specific action is to reset the memory cell 100 and determine whether the memory cell 100 has been successfully reset. If the memory cell 100 has not been successfully reset, the memory cell 100 is reset again until the memory cell 100 has been successfully reset.

In step S810, the memory cell is programmed in a programming mode. In this embodiment, step S810 is the same as step S120, thus, the description of step S810 is omitted for brevity. It is determined whether the memory cell 100 has been successfully programmed (step S820). In this embodiment, step S820 is the same as step S124, thus, the description of step S820 is omitted for brevity.

If the memory cell 100 has been successfully programmed, the programming procedure ends (step S860). If the memory cell 100 has not been successfully programmed, a reset action is executed (step S830). In one embodiment, the times of executing the reset action is 2 or greater than 2.

In this embodiment, Step S830 comprises steps S831~S833. In step S831, a second controlling voltage $Vg2_{(RES)}$ is provided to the gate of the transistor 111. In step S832, a first reset voltage $Vs1_{(RES)}$ is provided to the node 115. In step S833, a second reset voltage $Vs2_{(RES)}$ is provided to the node 117.

It is determined whether the memory cell 100 has been successfully reset (step S840). If the memory cell 100 has been successfully reset, the reset action ends (step S860). In one embodiment, the memory cell 100 is programmed again, but the disclosure is not limited thereto. If the memory cell 100 has not been successfully reset, at least one of the second controlling voltage $Vg2_{(RES)}$, the first reset voltage $Vs1_{(RES)}$ and the second reset voltage $Vs2_{(RES)}$ is increased during a second attempt.

In one embodiment, only the second controlling voltage $Vg2_{(RES)}$ is increased and the first reset voltage $Vs1_{(RES)}$ and the second reset voltage $Vs2_{(RES)}$ are maintained. Then, the increased second controlling voltage $Vg2_{(RES)}$ and the maintained first and second reset voltages $Vs1_{(RES)}$ and $Vs2_{(RES)}$ are provided to the memory cell 100 again. In another embodiment, the second controlling voltage $Vg2_{(RES)}$ and second reset voltage $Vs2_{(RES)}$ are maintained and the first reset voltage $Vs1_{(RES)}$ is increased. In other embodiments, the second controlling voltage $Vg2_{(RES)}$ and the first reset voltage $Vs1_{(RES)}$ are increased and the second reset voltage $Vs2_{(RES)}$ is maintained.

After the second attempt, it is determined whether the memory cell 100 has been successfully reset (step S840). If the memory cell 100 has been successfully reset, the reset action ends (step S860). In one embodiment, a programming action is executed to program the memory cell 100. If the memory cell 100 has not been successfully reset, at least one of the second controlling voltage $Vg2_{(RES)}$, the first reset voltage $Vs1_{(RES)}$ and the second reset voltage $Vs2_{(RES)}$ is increased during a third attempt. The increased voltage and the maintained voltages are provided to the memory cell 100.

In one embodiment, the node receiving the increased voltage during the second attempt is the same or different from the node receiving the increased voltage during the third attempt. For example, assume the second controlling voltage $Vg2_{(RES)}$ is increased and provided to the gate of the transistor 111 during the second attempt. In one embodiment, second the controlling voltage $Vg2_{(RES)}$ is again increased and provided to the gate of the transistor 111 during the third attempt. In another embodiment, the first reset voltage $Vs1_{(RES)}$ is increased and provided to the first node 115 during the third attempt. In other embodiments, the second controlling voltage $Vg2_{(RES)}$ and the first reset voltage $Vs1_{(RES)}$ are increased during the third attempt.

The disclosure does not limit the level of the increased voltage. In one embodiment, the voltage is gradually increased. Additionally, the times of resetting the memory cell is 2 or greater than 2.

While the disclosure has been described by way of example and in terms of the embodiments, it is to be understood that the disclosure is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A control method for at least one memory cell comprising a transistor and a resistor connected to the transistor in series between a first node and a second node, comprising:
    programming the memory cell in a programming mode, wherein the step of programming the memory cell comprises:
        providing a first controlling voltage to a gate of the transistor;
        providing a first setting voltage to the first node; and
        providing a second setting voltage to the second node;
        determining whether the memory cell has been successfully programmed;
        when the memory cell has been successfully programmed, impedance of the memory cell is in a first state, and
        when the memory cell has not been successfully programmed, a specific action is executed, wherein the specific action is to reset the memory cell, and the step of resetting the memory cell comprises:
            providing a second controlling voltage to the gate of the transistor, wherein the first controlling voltage is less than the second controlling voltage;
            providing a first reset voltage to the first node; and
            providing a second reset voltage to the second node,
        wherein the impedance of the memory cell is in a second state when the memory cell is successfully reset, and wherein the impedance of the memory cell in the second state is higher than the impedance of the memory cell in the first state; wherein the step of resetting the memory cell further comprises:
            determining whether the memory cell has been successfully reset;
            when the memory cell has been successfully reset, the impedance of the memory is in the first state;
            when the memory has not been successfully reset, at least one of the second controlling voltage, the first reset voltage and the second reset voltage is increased and the increased voltage is provided to the transistor.

2. The control method as claimed in claim 1, wherein the first setting voltage and the second reset voltage are positive.

3. The control method as claimed in claim 2, wherein the second setting voltage is equal to the first reset voltage.

4. The control method as claimed in claim 1, wherein the first setting voltage is positive and the first reset voltage is negative.

5. The control method as claimed in claim 4, wherein the second setting voltage is equal to the second reset voltage.

6. The control method as claimed in claim 1, wherein the specific action further comprises programming the memory cell again, wherein the step of programming the memory cell again comprises:
    providing a third controlling voltage to the gate of the transistor;
    providing a third setting voltage to the first node; and
    providing a fourth setting voltage to the second node.

7. The control method as claimed in claim 6, wherein the third controlling voltage is equal to the first controlling voltage and the third controlling voltage is less than the second controlling voltage.

8. The control method as claimed in claim 7, wherein the third setting voltage is greater than the first setting voltage.

9. The control method as claimed in claim 8, wherein the fourth setting voltage is equal to the second setting voltage.

10. The control method as claimed in claim 6, wherein the third controlling voltage is greater than the first controlling voltage and the third controlling voltage is less than the second controlling voltage.

11. The control method as claimed in claim 10, wherein the third setting voltage is equal to the first setting voltage and the fourth setting voltage is equal to the second setting voltage.

12. The control method as claimed in claim 6, wherein the specific action is to execute the step of resetting the memory cell and then execute the step of programming the memory cell again.

13. The control method as claimed in claim 6, wherein the specific action is to execute the step of programming the memory cell again and then execute the step of resetting the memory cell.

14. The control method as claimed in claim 6, wherein the step of programming the memory cell again further comprises:
   providing a fourth controlling voltage to the gate of the transistor;
   providing a fifth setting voltage to the first node; and
   providing a sixth setting voltage to the second node.

15. The control method as claimed in claim 14, wherein the first, the third, and the fourth controlling voltages are the same and the fourth controlling voltage is less than the second controlling voltage.

16. The control method as claimed in claim 15, wherein the fifth setting voltage is greater than the third setting voltage and the third setting voltage is greater than the first setting voltage.

17. The control method as claimed in claim 16, wherein the difference between the third and the fifth setting voltages is equal to the difference between the first and the third setting voltages.

18. The control method as claimed in claim 17, wherein the sixth setting voltage is equal to the fourth setting voltage and the fourth setting voltage is equal to the second setting voltage.

19. The control method as claimed in claim 14, wherein the fourth controlling voltage is greater than the third controlling voltage, the third controlling voltage is greater than the first controlling voltage, and the fourth controlling voltage is less than the second controlling voltage.

20. The control method as claimed in claim 19, wherein the fifth setting voltage is equal to the third setting voltage, the third setting voltage is equal to the first setting voltage, the sixth setting voltage is equal to the fourth setting voltage, and the fourth setting voltage is equal to the second setting voltage.

21. The control method as claimed in claim 14, wherein the specific action is to execute the step of resetting the memory cell and then execute the step of programming the memory cell again.

22. The control method as claimed in claim 14, wherein the specific action is to execute the step of programming the memory cell again and then execute the step of resetting the memory cell.

23. The control method as claimed in claim 14, further comprising: a forming mode, wherein in the forming mode:
   providing an initial voltage to the gate of the transistor;
   providing a first initial setting voltage to the first node, wherein the first initial setting voltage is greater than the fifth setting voltage; and
   providing a second initial setting voltage to the second node.

24. The control method as claimed in claim 1, further comprising a forming mode, wherein in the forming mode:
   providing an initial voltage to the gate of the transistor;
   providing a first initial setting voltage to the first node; and
   providing a second initial setting voltage to the second node.

25. The control method as claimed in claim 24, wherein the initial voltage is less than the first controlling voltage.

26. The control method as claimed in claim 25, wherein the first initial setting voltage is greater than the first setting voltage.

27. The control method as claimed in claim 26, wherein the second initial setting voltage is equals to the second setting voltage.

28. The control method as claimed in claim 24, wherein the second controlling voltage is greater than the initial voltage.

29. The control method as claimed in claim 1, wherein when the memory has not been successfully reset, the second controlling voltage is increased and provided to the gate of the transistor, the first reset voltage is maintained and provided to the first node, and the second reset voltage is maintained and provided to the second node.

30. The control method as claimed in claim 1, wherein when the memory has not been successfully reset, the second controlling voltage is maintained and provided to the gate of the transistor, the first reset voltage is increased and provided to the first node, and the second reset voltage is maintained and provided to the second node.

31. The control method as claimed in claim 1, wherein when the memory has not been successfully reset, the second controlling voltage is increased and provided to the gate of the transistor, the first reset voltage is increased and provided to the first node, and the second reset voltage is maintained and provided to the second node.

* * * * *